(12) United States Patent
Zilberman et al.

(10) Patent No.: US 6,946,981 B1
(45) Date of Patent: Sep. 20, 2005

(54) TRANSMITTER AND METHOD THEREON

(75) Inventors: Shiri Zilberman, Modi'in (IL); Asaf Schushan, Ramat Hasharon (IL); Yaron Aharoni, Jerusalem (IL); Doron Rainish, Ramat Gan (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/745,623

(22) Filed: Dec. 29, 2003

(51) Int. Cl.⁷ .............................................. H03M 7/00
(52) U.S. Cl. ......................................... 341/50; 341/51
(58) Field of Search ............................. 341/50, 51, 65, 341/67; 375/133, 134, 135, 136, 137; 370/395.64

(56) References Cited

U.S. PATENT DOCUMENTS 5,416,797 A    5/1995  Gilhousen et al.
6,751,250 B2 * 6/2004  Kirke et al. ................ 375/133
6,763,025 B2 * 7/2004  Leatherbury et al. .. 370/395.64
2002/0034167 A1 3/2002  Ozluturk et al.

OTHER PUBLICATIONS

Copy of International Search Report from PCT/US2004/040688, mailed on Apr. 29, 2005.

* cited by examiner

Primary Examiner—Peguy Jeanpierre
Assistant Examiner—Joseph Lauture
(74) Attorney, Agent, or Firm—Pearl Cohen Zedek Latzer, LLP

(57) ABSTRACT

Briefly, an apparatus that may include scrambler to scramble data bits and control bit and filters to filter the scrambled data bits and control bits. The apparatus may also include a processor to adjust the gains of the filters.

20 Claims, 3 Drawing Sheets

TRANSMITTER AND METHOD THEREON

A transmitter architecture that may be used with Wideband Code Division Multiple Access (WCDMA) systems, also known in the art as ITU IMT-2000 Spread spectrum standard, may generate chips of data symbols by spreading data and control bits using an Orthogonal Variable Spreading Factor (OVSF) code, applying different gains to the data and control bits and scrambling the spread-gained data and control bits to generate the data chips.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
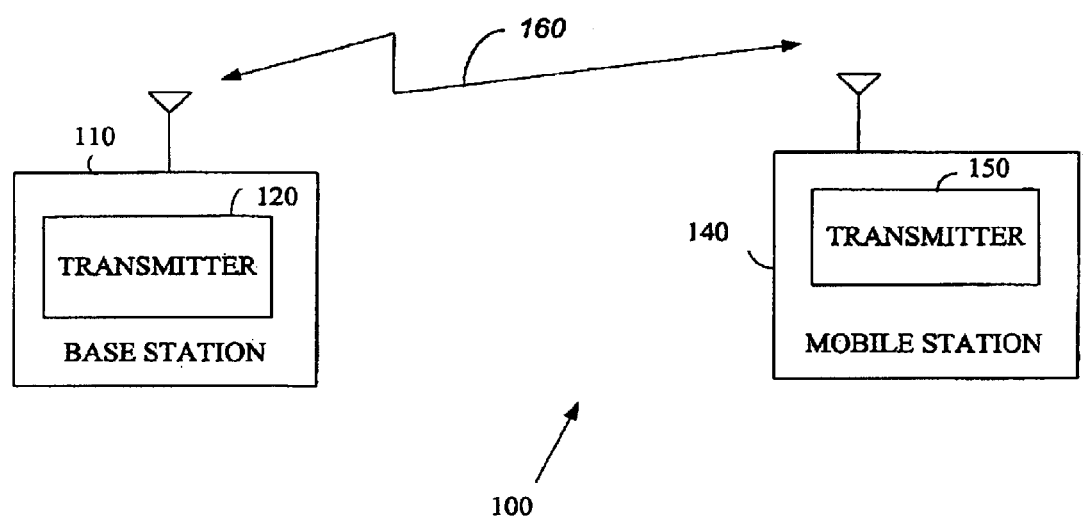
FIG. 1 is a schematic illustration of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

It should be understood that the present invention may be used in a variety of applications. Although the present invention is not limited in this respect, the circuits and techniques disclosed herein may be used in many apparatuses such as transmitters of a radio system. Transmitters intended to be included within the scope of the present invention include, by a way of example only, cellular radiotelephone transmitters, two-way radio transmitters, digital system transmitters, wireless local area network transmitters, wideband transmitters, ultra wideband transmitters, and the like.

Types of cellular radiotelephone transmitters intended to be within the scope of the present invention may include, but are not limited to, Code Division Multiple Access (CDMA), CDMA-2000 and wide band CDMA (WCDMA) cellular radiotelephone transmitters for receiving spread spectrum signals, transmitters for global system for mobile communication (GSM), transmitters for third generation cellular systems (3G), orthogonal frequency division multiplexing (OFDM) transmitters, and the like.

Turning first to FIG. 1, a schematic illustration of a wireless communication system 100 according to an exemplary embodiment of the present invention is shown. Although the scope of the present invention is not limited to this example, wireless communication system 100 may include at least one base station 110 and at least one mobile station 140. In some embodiments of the invention, base station 110 may include a transmitter 120 and mobile station 140 may include a transmitter 150. Transmitters 120 and 150 may have an architecture suitable for WCDMA communication systems, although the scope of the present invention is not limited in this respect.

Although the scope of the present invention is not limited in this respect, base station 110 may transmit symbols that include chips at a desired chip rate over a channel 160, if desired. Mobile station 140 may also transmit symbols that include chips at a desired chip rate to base station 110 over channel 160, if desired.

Figure 2:
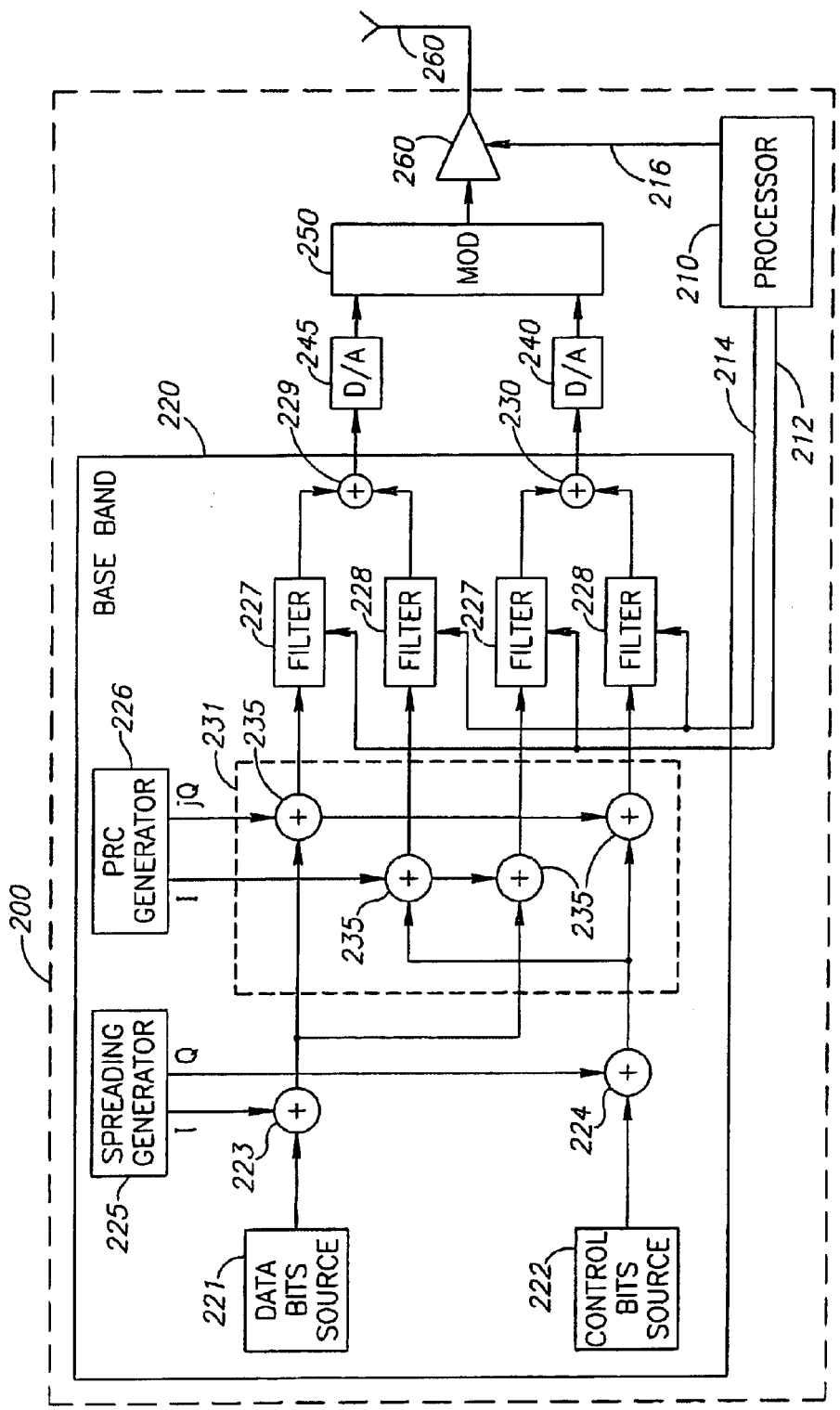
FIG. 2 is a block diagram of a transmitter according to one exemplary embodiment of the present invention.

Turning to FIG. 2, a block diagram of a transmitter 200 according to an exemplary embodiment of the present invention is shown. Although the scope of the present invention is not limited in this respect, in some embodiments of the present invention, transmitter 200 may include a processor 210, a baseband unit 220, digital to analog (D/A) converters 240, 245, modulator (MOD) 250, a power amplifier (PA) 260, and at least one antenna 270.

Although the scope of the present invention is not limited in this respect, baseband unit 220 may be a digital baseband unit and may include a data bit source 221, a control bit source 222, an adder 223, an adder 224, a spreading generator 225, a pseudo-random code (PRC) generator 226, shape filters 227, shape filters 228, an adder 229, an adder 230, and a scrambler 231. Although the scope of the present invention is not limited in this respect, scrambler 231 may include adders 235.

Although the scope of the present invention is not limited in this respect, processor 210 may be a digital signal processor (DSP), a controller, or any other suitable type of processor. Processor 210 may control the gains of shape filters 227, shape filters 228 and PA 260, if desired.

Although the scope of the present invention is not limited in this respect, baseband unit 220 may be a digital base band and may be implemented by software, by hardware or by any combination of software and/or hardware, if desired. In some embodiments of the invention, data bits source 221 may provide, for example, data bits generated by a packet switch source, data bits generated by a computer communication network (e.g., Internet) or circuit source such as, for example, audio vocoders, video vocoder or the like. Furthermore, data bits may also undergo various manipulations such as, for example, channel encoding, ciphering, interleaving, or any other bit manipulation known in the art. Control bits source 222 may provide pilot bits, synchronization patterns, control information for power control, data structure, or any other suitable control information known in the art. In embodiments of the invention, spreading code generator 225 may generate spreading sequences such as, for example, a Walsh sequence, Hadamard sequence, or the like. Spreading code generator 225 may provide in-phase (I) spreading bits to adder 223 and quadrature (Q) spreading bits to adder 224. In some embodiments of the invention, PRC generator 226, for example, a Gold generator, a pseudo-noise (PN) generator or any other type of generator of pseudo-random sequences may provide I and Q PRC bits to scrambler 231.

Although the scope of the present invention is not limited in this respect, for example, scrambler 231 may include four adders 235. In some embodiments of the invention, adders 235 may add I and/or jQ PRC bits to output bits of adder 223 and/or adder 224, to provide a scrambled output of scrambled control bits and scrambled data bits, for example, a scrambled I+jQ signal, to shape filters 227 and to shape filters 228, respectively, if desired.

Although the scope of the present invention is not limited in this respect, shape filters 227 may provide a digital I shaped signal to D/A 245 and shape filters 228 may provide a digital shaped signal to D/A 240. In some embodiments of the invention, D/As 245 and 240 may convert the digital I and Q signals, respectively, into analog I and Q signals, respectively, that may be provided to modulator 250. In some embodiments of the invention, modulator 250 may modulate and combine the I and Q analog signals, as is known in the art, and may generated a modulated RF signal. PA 260 may amplify and transmit the modulated RF signal via antenna 270.

Although the scope of the present invention is not limited in this respect, modulator 250 may modulate the I, Q analog signals according to a desired modulation scheme such as, for example, binary phase shift keying (BPSK), quadrature phase shift keying (QPSK), quadrature-amplitude modulation (QAM) with different order such as, for example, QAM16, QAM32, QAM64, QAM128, QAM256, etc., differential BPSK (DBPSK), differential QPSK (DQPSK), or the like.

Although the scope of the present invention is not limited in this respect, types of antennas that may be used for at least one antenna 270 may include an internal antenna, a dipole antenna, an omni-directional antenna, a monopole antenna, an end fed antenna, a circularly polarized antenna, a microstrip antenna, a diversity antenna, and the like. In some embodiments of the invention, more multiple antennas may be used, if desired.

Although it should be understood that the scope of the present invention is not limited in this respect, processor 210 may provide beta values $\beta$(e.g. via control line 212) and $\beta$(e.g. via control line 214) to filters 227 and 228, respectively. In some embodiments of the invention, due to a wide range of beta values, for example, the exemplary beta value ranges provided below, the coefficients of filters 227, 228 may have a wide dynamic range. In order to provide constant root-mean square (RMS) level of I and Q signals, and a desired error vector magnitude (EVM) ratio, the beta values may be multiplied by filters 227, 228 coefficients to provide the desired EVM ratio. In addition, processor 210 may use a control line 216 to vary the power of PA 260 to a desired power level.

Although the scope of the present invention is not limited in this respect, calculations based on exemplary beta values and a desired power levels are given below. For example, if $\beta c = 1/15$ and $\beta d = 1$, at a nominal power level of 2, the corresponding control values provided to PA 260 may be calculated to be $\beta C' = 1/15 * 3.98 = 0.26$ and $\beta d' = 1 * 3.98$, and the RF compensation in this example may be equal to $-27.6$ dB (e.g. $20\log(3.98)$). In some embodiments of the invention, the RMS value at the output of D/A 245, 240 may be substantially constant and may be, for example, a maximum over the range of the possible gain values, if desired.

Figure 3:
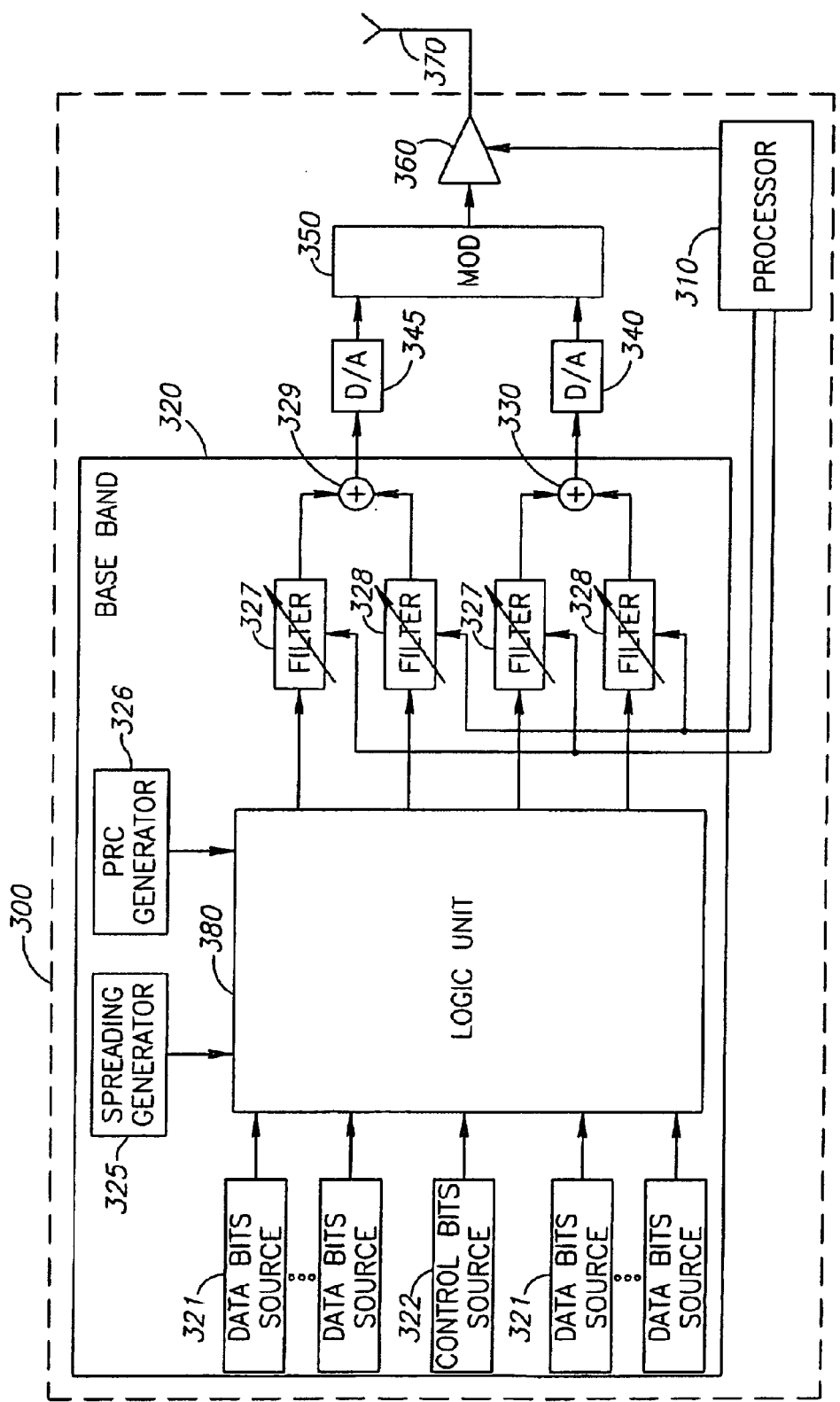
FIG. 3 is a block diagram of a transmitter according to another exemplary embodiment of the present invention.

Turning to FIG. 3 a block diagram of a transmitter 300 according to another exemplary embodiment of the present invention is shown. Although the scope of the present invention is not limited in this respect, in some embodiments of the present invention, transmitter 300 may include a processor 310, a baseband unit 320, digital to analog (D/A) converters 345, 340, modulator (MOD) 350, a power amplifier (PA) 360, and at least one antenna 370.

Although the scope of the present invention is not limited in this respect, baseband unit 320 may be a digital baseband unit and may include a data bit source 321, a control bit source 322, a spreading generator 325, a pseudo-random code (PRC) generator 326, shape filters 327 and shape filters 328 and a logic unit 380. It should be understood that transmitter 300 may perform functions substantially similar to the functions preformed by transmitter 200 of FIG. 2, as described above, and may include similar components. For example, logic unit 380 may include components similar or identical to adder 223, adder 224, adder 229, adder 230 and scrambler 231 of FIG. 2, if desired.

Although the scope of the present invention is not limited in this respect, in some embodiments, the at least one data bit source 321 of baseband unit 320 may include a plurality of data bit sources 321, which may provide data bits to a plurality of data channels, and control bit source 322 that may provide control bits to a control channel, if desired. Although the scope of the present invention is not limited in this respect, in some embodiments of the invention the gain of filters 327 and 328 may be adjusted by processor 310, if desired.

While certain features of the invention have been illustrated and described herein, many modifications, substitutions, changes, and equivalents will now occur to those skilled in the art. It is, therefore, to be understood that the appended claims are intended to cover all such modifications, substitutions, changes, and equivalents as may fail within the true spirit of the invention.

What is claimed is:

1. An apparatus comprising:
    a scrambler to provide scrambled data bits and scrambled control bits by scrambling data bits and control bits, respectively, with pseudo-random code bits; and
    a first filter to filter said scrambled data bits;
    a second filter to filter said scrambled control bits; and
    a processor to control first and second gains of the first and second filters, respectively.

2. The apparatus of claim 1, comprising:
    a pseudo-random code generator to provide the pseudo-random code bits.

3. The apparatus of claim 2, wherein the pseudo-random code generator is able to generate bits according to a Gold code.

4. The apparatus of claim 1 comprising:
    a spreading generator to provide in-phase spreading bits to be added to the data bits and quadrature spreading bits to be added to the control bits.

5. The apparatus of claim 1, wherein the scrambler comprises two or more adders to add the pseudo-random code bits to the data bits and to the control bits.

6. The apparatus of claim 1, comprising a baseband unit including at least said scrambler and said first and second filters.

7. The apparatus of claim 6 comprising a digital to analog converter to convert a digital output of the baseband unit to an analog signal.

8. A method comprising:
controlling first and second gains of first and second filter, respectively, wherein the first filter to filter scrambled data bits and the second filter to filter scrambled control bits.

9. The method of claim 8, comprising scrambling data bits and control bits with a pseudo-random code.

10. The method of claim 9, wherein scrambling comprises:
adding the pseudo-random code to the data bits and to the control bits.

11. A wireless communication device comprising:
an internal antenna to transmit radio frequency signal that include scrambled data and control bits;
a scrambler to provide the scrambled data bits and the scrambled control bits by scrambling data bits and control bits, respectively, with pseudo-random code bits; and
a first filter to filter said scrambled data bits;
a second filter to filter said scrambled control bits; and
a processor to control first and second gains of the first and second filters, respectively.

12. The apparatus of claim 11, comprising:
a pseudo-random code generator to provide the pseudo-random code bits.

13. The apparatus of claim 12, wherein the pseudo-random code generator is able to generate bits according to a Gold code.

14. The apparatus of claim 11 comprising:
a spreading generator to provide in-phase spreading bits to be added to the data bits and quadrature spreading bits to be added to the control bits.

15. The apparatus of claim 11, wherein the scrambler comprises two or more adders to add the pseudo-random code bits to the data bits and to the control bits.

16. The apparatus of claim 11, comprising a baseband unit including at least said scrambler and said first and second filters.

17. The apparatus of claim 16 comprising a digital to analog converter to convert a digital output of the baseband unit to an analog signal.

18. A wireless communication system comprising:
a wireless communication device includes:
a scrambler to provide scrambled data bits and scrambled control bits by scrambling data bits and control bits, respectively, with pseudo-random code bits; and
a first filter to filter said scrambled data bits;
a second filter to filter said scrambled control bits; and
a processor to control first and second gains of the first and second filters, respectively.

19. The wireless communication system of claim 18 wherein the wireless communication device comprises:
a pseudo-random code generator to provide the pseudo-random code bits; and
a spreading generator to provide in-phase spreading bits to be added to the data bits and quadrature spreading bits to be added to the control bits.

20. The wireless communication system of claim 18 wherein the wireless communication device comprises two or more adders to add the pseudo-random code bits to the data bits and to the control bits.

* * * * *